US012327611B2

(12) United States Patent
Yang

(10) Patent No.: US 12,327,611 B2
(45) Date of Patent: Jun. 10, 2025

(54) DATA STROBE LATCHING CIRCUIT AND ADJUSTING METHOD FOR ADJUSTING INTERNAL WRITE LATENCY SIGNAL

(71) Applicant: NANYA TECHNOLOGY CORPORATION, New Taipei (TW)

(72) Inventor: Shu-Wei Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 145 days.

(21) Appl. No.: 18/193,648

(22) Filed: Mar. 31, 2023

(65) Prior Publication Data
US 2024/0331751 A1    Oct. 3, 2024

(51) Int. Cl.
*G11C 7/22* (2006.01)
*G11C 7/10* (2006.01)

(52) U.S. Cl.
CPC ............ *G11C 7/222* (2013.01); *G11C 7/1093* (2013.01)

(58) Field of Classification Search
CPC .............................. G11C 7/222; G11C 7/1093
USPC ........................................................ 365/233.1
See application file for complete search history.

(56) References Cited

U.S. PATENT DOCUMENTS 10,418,090 B1 * 9/2019 Liu ...................... G11C 11/4096
2021/0241805 A1 * 8/2021 Penney .................. G11C 7/222

FOREIGN PATENT DOCUMENTS

TW         202221711         6/2022

OTHER PUBLICATIONS

"Office Action of Taiwan Counterpart Application", issued on Jul. 18, 2024, p. 1-p. 6.

* cited by examiner

*Primary Examiner* — Amir Zarabian
*Assistant Examiner* — Daniel John King
(74) *Attorney, Agent, or Firm* — JCIPRNET

(57) ABSTRACT

A data strobe latching circuit and an adjusting method for adjusting an internal write latency signal are provided. The DQS latching circuit includes a receiver, a counting circuit and a timing adjusting circuit. The receiver receives a DQS signal. The counting circuit counts at least one pulse of the DQS signal to generate an adjusting value. The timing adjusting circuit adjusts a timing of the internal write latency signal according to the adjusting value.

15 Claims, 7 Drawing Sheets

DATA STROBE LATCHING CIRCUIT AND ADJUSTING METHOD FOR ADJUSTING INTERNAL WRITE LATENCY SIGNAL

BACKGROUND

Technical Field

The disclosure generally relates to a latching circuit and an adjusting method, and more particularly to a data strobe latching circuit and an adjusting method for adjusting an internal write latency signal of a memory device.

Description of Related Art

Please refer to FIG. 1, FIG. 1 illustrates a timing diagram of a data strobe (DQS) signal and an internal write latency signal. Generally, a memory device performs a write operation according to the DQS signal S_DQS and the internal write latency signal S_IWL. The JEDEC[SM] DDR5 standard teaches that the DQS signal S_DQS has two pulses. When a second pulse of the DQS signal S_DQS is in a pulse width tWLP of the internal write latency signal S_IWL, the memory device performs a write operation.

However, based on actual design requirements, a pulse number of the DQS signal S_DQS may be modified. For example, the pulse number of the DQS signal S_DQS may be modified after a write leveling training. It should be noted, the DQS signal S_DQS after modified may not match a timing of the internal write latency signal S_IWL. Therefore, the write operation may be abnormal.

SUMMARY

The disclosure provides a data strobe latching circuit and an adjusting method for adjusting an internal write latency signal of a memory device. The data strobe latching circuit and the adjusting method adjust the internal write latency signal according to a data strobe (DQS) signal.

The data strobe (DQS) latching circuit of the disclosure is used to adjust the internal write latency signal of the memory device. The DQS latching circuit includes a receiver, a counting circuit and a timing adjusting circuit. The receiver receives a DQS signal. The counting circuit is coupled to the receiver. The counting circuit counts at least one pulse of the DQS signal to generate an adjusting value. The timing adjusting circuit is coupled to the pulse counter. The timing adjusting circuit adjusts a timing of the internal write latency signal according to the adjusting value.

The adjusting method of the disclosure is used to adjust the internal write latency signal of the memory device. The adjusting method includes: receiving a data strobe (DQS) signal; counting, by a counting circuit, at least one pulse of the DQS signal to generate an adjusting value; and adjusting, by a timing adjusting circuit, a timing of the internal write latency signal according to the adjusting value.

Based on the above, the DQS latching circuit and the adjusting method adjust the internal write latency signal according to the adjusting value associated with a number of the at least one pulse. The DQS latching circuit and the adjusting method make the timing of the internal write latency signal matches a timing of the DQS signal. Therefore, even the DQS signal is modified, a write operation of the memory device is normal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 2:
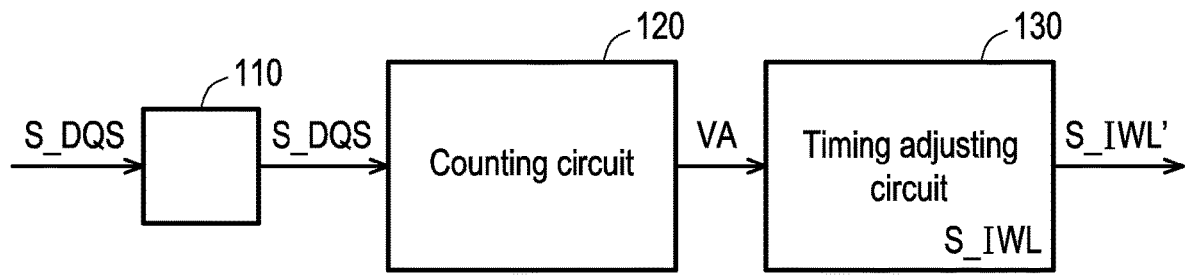
FIG. 2 illustrates a schematic diagram of a data strobe (DQS) latching circuit according to a first embodiment of the disclosure.

FIG. 2 illustrates a schematic diagram of a data strobe (DQS) latching circuit according to a first embodiment of the disclosure. Please refer to FIG. 2, in the embodiment, the DQS latching circuit 100 is used to adjust an internal write latency signal S_IWL of a memory device. The memory device is a dynamic random access memory (DRAM) device. The memory device may be a double data rate synchronous DRAM (DDR SDRAM) device, but the disclosure is not limited thereto. In the embodiment, the DQS latching circuit 100 includes a receiver 110, a counting circuit 120 and a timing adjusting circuit 130. The receiver 110 receives a DQS signal S_DQS. For example, the receiver 110 captures the DQS signal S_DQS in the memory device. For example, the receiver 110 captures the DQS signal S_DQS in the memory device. The receiver 110 receives the DQS signal S_DQS inputs by an operator or an engineer.

In the embodiment, the counting circuit 120 is coupled to the receiver 110. The counting circuit 120 receives the DQS signal S_DQS from the receiver 110. The counting circuit 120 counts at least one pulse of the DQS signal S_DQS to generate an adjusting value VA. In the embodiment, the adjusting value VA may be a count value. The adjusting value VA is proportional to a number of the at least one pulse of the DQS signal S_DQS.

In the embodiment, the timing adjusting circuit 130 is coupled to the pulse counter 120. The timing adjusting circuit 130 receives the adjusting value VA from the counting circuit 120. The timing adjusting circuit 130 adjusts a timing of the internal write latency signal S_IWL according to the adjusting value VA.

For example, the timing adjusting circuit 130 receives the internal write latency signal S_IWL and the adjusting value VA. The timing adjusting circuit 130 adjusts the internal write latency signal S_IWL to generate an adjusted internal write latency signal S_IWL' according to the adjusting value VA. For example, the timing adjusting circuit 130 generate the internal write latency signal S_IWL, and adjusts the internal write latency signal S_IWL to generate an adjusted internal write latency signal S_IWL' according to the adjusting value VA.

It should be noted, the DQS latching circuit 100 adjusts the internal write latency signal S_IWL according to the adjusting value VA associated with a number of the at least one pulse of the DQS signal S_DQS. The DQS latching circuit 100 makes the timing of the internal write latency signal S_IWL matches a timing of the DQS signal S_DQS. Therefore, even the DQS signal S_DQS is modified, a write operation of the memory device is normal.

In the embodiment, the DQS latching circuit 100 may be located in a peripheral circuit of the memory device, but the disclosure is not limited thereto.

In the embodiment, timing adjusting circuit 130 may be implemented by a delay-locked loop (DLL) circuit, but the disclosure is not limited thereto.

Figure 1:
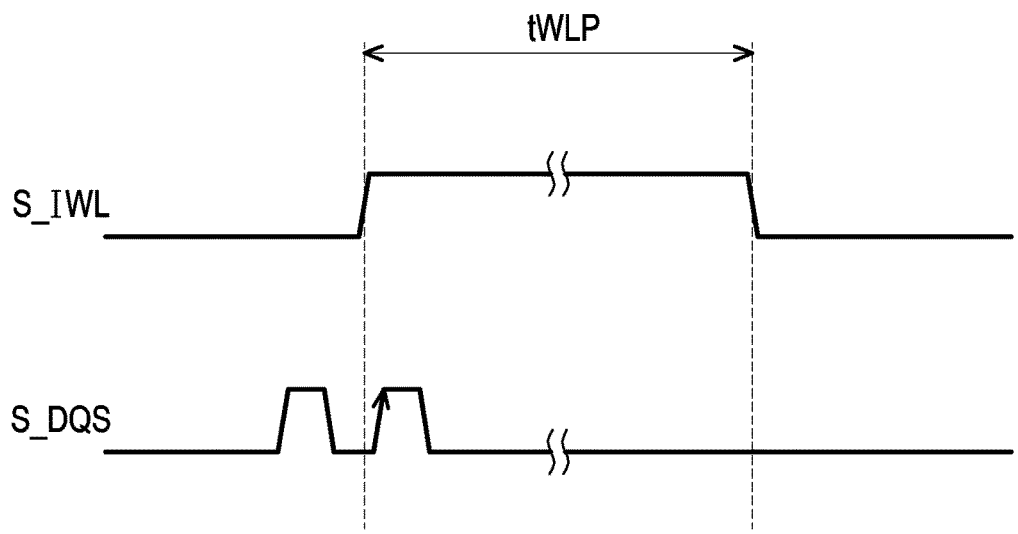
FIG. 1 illustrates a timing diagram of a data strobe (DQS) signal and an internal write latency signal.
Figure 3:
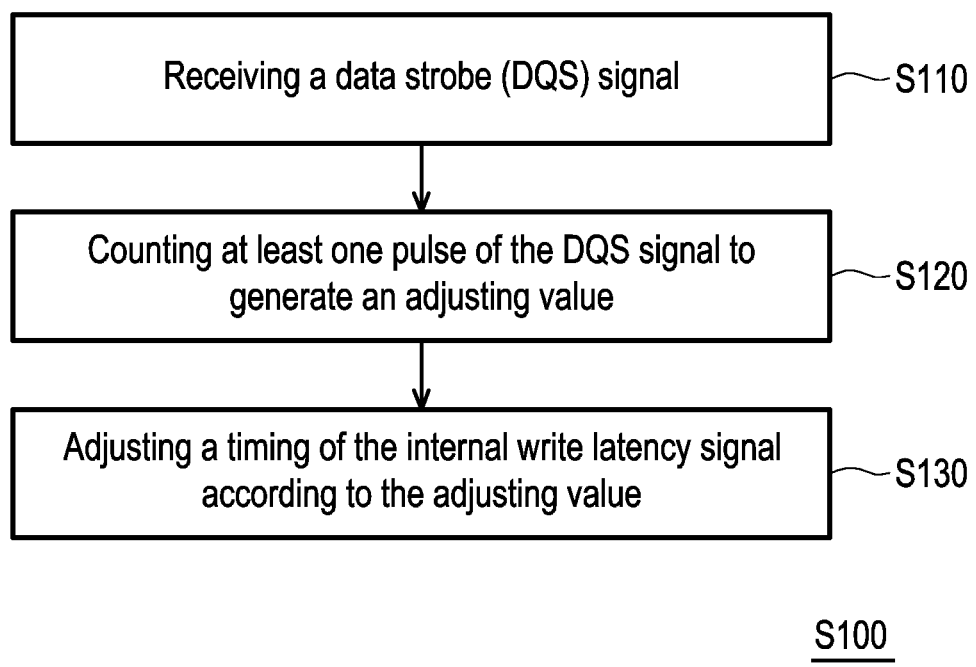
FIG. 3 illustrates a flow chart of an adjusting method according to an embodiment of the disclosure.

FIG. 3 illustrates a flow chart of an adjusting method according to an embodiment of the disclosure. Please refer to FIG. 2 and FIG. 3, the adjusting method S100 is used to adjust the internal write latency signal S_IWL. The adjusting method S100 is suitable for operating the DQS latching circuit 100. In the embodiment, the adjusting method S100 includes steps S110, S120 and S130. In the steps S110, the DQS signal S_DQS is received by the receiver 110. In the steps S120, the counting circuit 120 counts at least one pulse of the DQS signal S_DQS to generate the adjusting value VA. In the steps S130, the timing adjusting circuit 130 adjusts the timing of the internal write latency signal S_IWL according to the adjusting value VA. The detail operation of the steps S110 to S130 has been clearly explained in the embodiments of FIG. 1, so it will not be repeated here.

Figure 4:
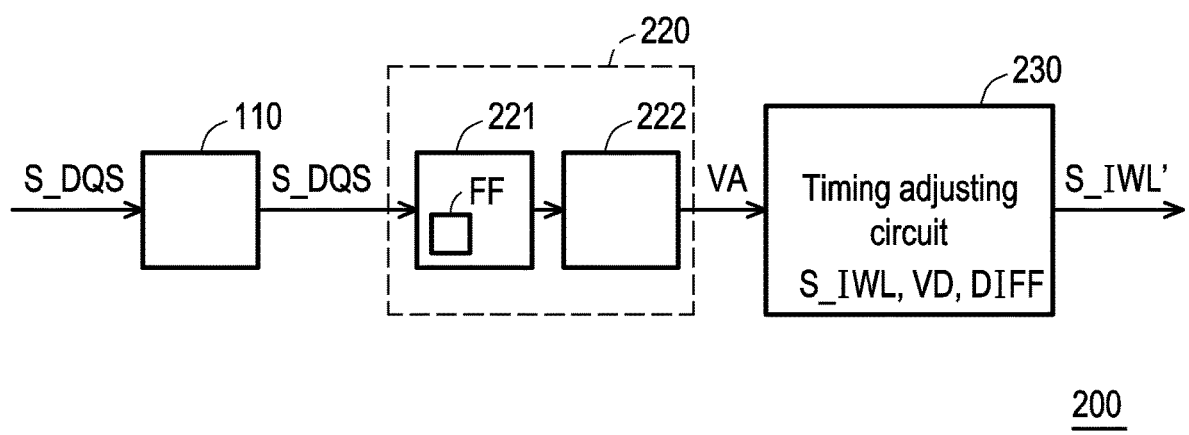
FIG. 4 illustrates a schematic diagram of a data strobe (DQS) latching circuit according to a second embodiment of the disclosure.

FIG. 4 illustrates a schematic diagram of a data strobe (DQS) latching circuit according to a second embodiment of the disclosure. Please refer to FIG. 4, in the embodiment, the DQS latching circuit 200 includes a receiver 110, a counting circuit 220 and a timing adjusting circuit 230. The receiver 210 receives a DQS signal S_DQS. The counting circuit 220 in includes a trigger circuit 221 and an edge counter 222. The trigger circuit 221 is coupled to the receiver 110. The trigger circuit 221 obtains at least one edge of the at least one pulse of the DQS signal S_DQS. The edge counter 222 is coupled to the trigger circuit 221 and the timing adjusting circuit 230. The edge counter 222 counts the at least one edge of the at least one pulse of the DQS signal S_DQS to generate the adjusting value VA.

Figure 5A:
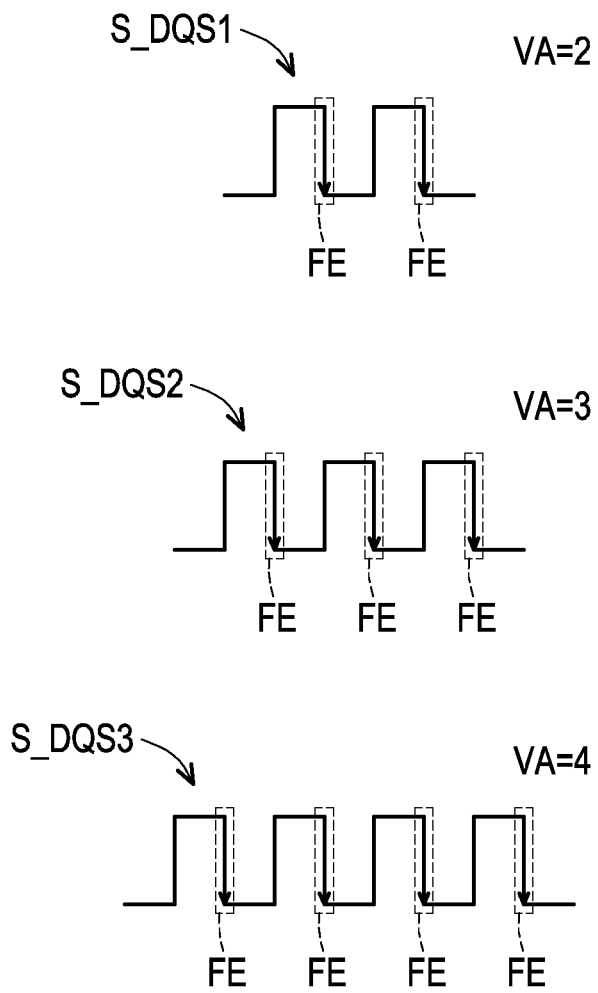
FIG. 5A and FIG. 5B illustrate pulse waveforms of data strobe (DQS) signals according to an embodiment of the disclosure.

FIG. 5A illustrates pulse waveforms of data strobe (DQS) signals according to an embodiment of the disclosure. Please refer to FIG. 4 and FIG. 5A, in the embodiment, FIG. 5A illustrates DQS signals S_DQS1, S_DQS2 and S_DQS3. The DQS signal S_DQS1 has a two-pulse waveform. The two-pulse waveform has two pulse. The DQS signal S_DQS2 has a three-pulse waveform. The three-pulse waveform has three pulse. The DQS signal S_DQS3 has a four-pulse waveform. The four-pulse waveform has four pulse. A pulse number of the pulse waveform of data strobe DQS signal of the disclosure may be one or more. The disclosure is not limited to the pulse number of the embodiment.

In the embodiment, the trigger circuit 221 obtains falling edges FE of pulses of the DQS signal S_DQS1. The edge counter 222 counts the falling edges FE of the pulses of the DQS signal S_DQS1 to generate an adjusting value VA corresponding to the DQS signal S_DQS1. Therefore, the adjusting value VA corresponding to the DQS signal S_DQS1 is "2". The trigger circuit 221 obtains falling edges FE of pulses of the DQS signal S_DQS2. The edge counter 222 counts the falling edges FE of the pulses of the DQS signal S_DQS2 to generate an adjusting value VA corresponding to the DQS signal S_DQS2. Therefore, the adjusting value VA corresponding to the DQS signal S_DQS2 is "3". Similarly, the trigger circuit 221 obtains falling edges FE of pulses of the DQS signal S_DQS3. The edge counter 222 counts the falling edges FE of the pulses of the DQS signal S_DQS3 to generate an adjusting value VA corresponding to the DQS signal S_DQS3. Therefore, the adjusting value VA corresponding to the DQS signal S_DQS3 is "4".

Figure 5B:
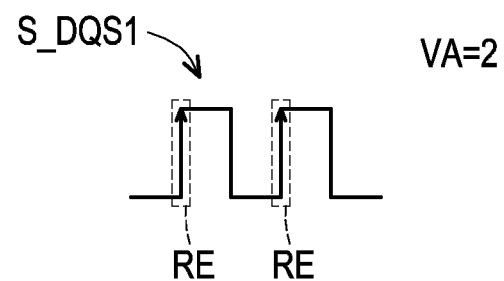
Figure 5B:
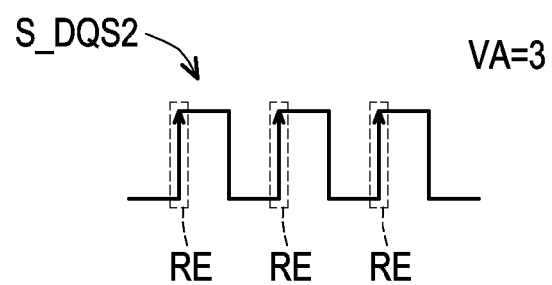
Figure 5B:
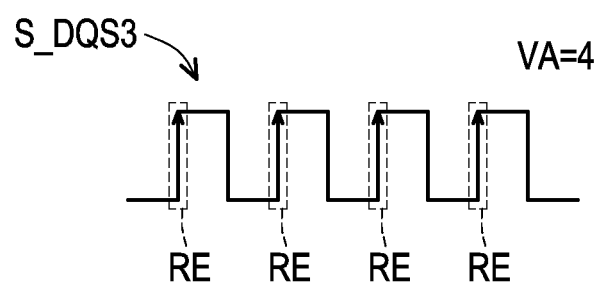

FIG. 5B illustrates pulse waveforms of data strobe (DQS) signals according to an embodiment of the disclosure. Please refer to FIG. 4 and FIG. 5B, in the embodiment, FIG. 5B illustrates DQS signals S_DQS1, S_DQS2 and S_DQS3. The trigger circuit 221 obtains rising edges RE of pulses of the DQS signal S_DQS1. The edge counter 222 counts the rising edges RE of the pulses of the DQS signal S_DQS1 to generate an adjusting value VA corresponding to the DQS signal S_DQS1. Therefore, the adjusting value VA corresponding to the DQS signal S_DQS1 is "2". The trigger circuit 221 obtains rising edges RE of pulses of the DQS signal S_DQS2. The edge counter 222 counts the rising edges RE of the pulses of the DQS signal S_DQS2 to generate an adjusting value VA corresponding to the DQS signal S_DQS2. Therefore, the adjusting value VA corresponding to the DQS signal S_DQS2 is "3". Similarly, the trigger circuit 221 obtains rising edges RE of pulses of the DQS signal S_DQS3. The edge counter 222 counts the rising edges RE of the pulses of the DQS signal S_DQS3 to generate an adjusting value VA corresponding to the DQS signal S_DQS3. Therefore, the adjusting value VA corresponding to the DQS signal S_DQS3 is "4".

Please refer to FIG. 4, in the embodiment, the trigger circuit 221 may be implemented by a flip-flop FF. For example, the flip-flop FF may be implemented by a D flip-flop, but the disclosure is not limited thereto. In the embodiment, the timing adjusting circuit 230 receives the adjusting value VA from the edge counter 222. The timing adjusting circuit 230 compares the adjusting value VA and a default value VD. The default value VD is a previous adjusting value VA of a previous DQS signal. The timing adjusting circuit 230 adjusts the internal write latency signal S_IWL to generate an adjusted internal write latency signal S_IWL' according to a comparing result between the adjusting value VA and the default value VD.

Figure 6:
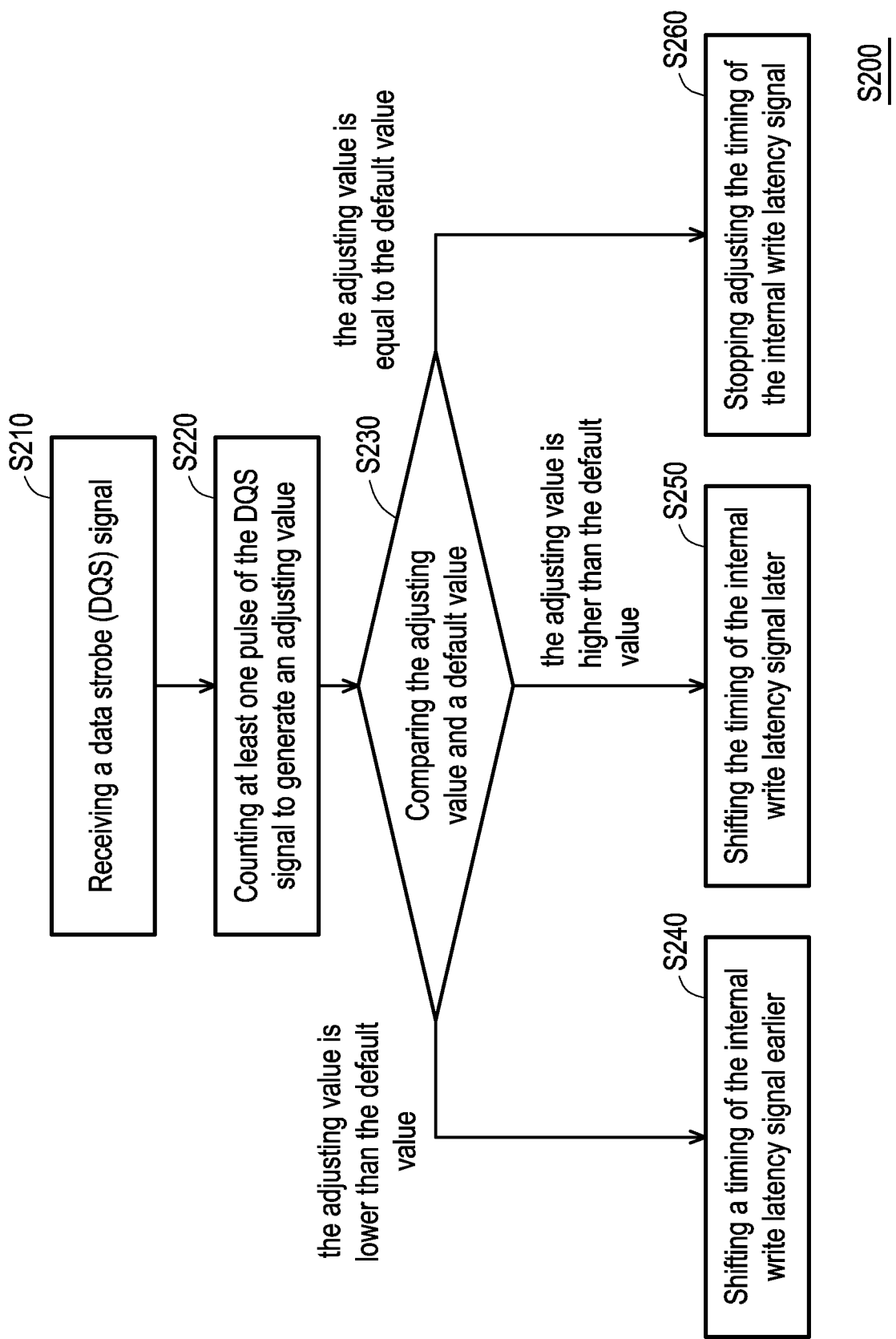
FIG. 6 illustrates a flow chart of an adjusting method according to an embodiment of the disclosure.
Figure 7:
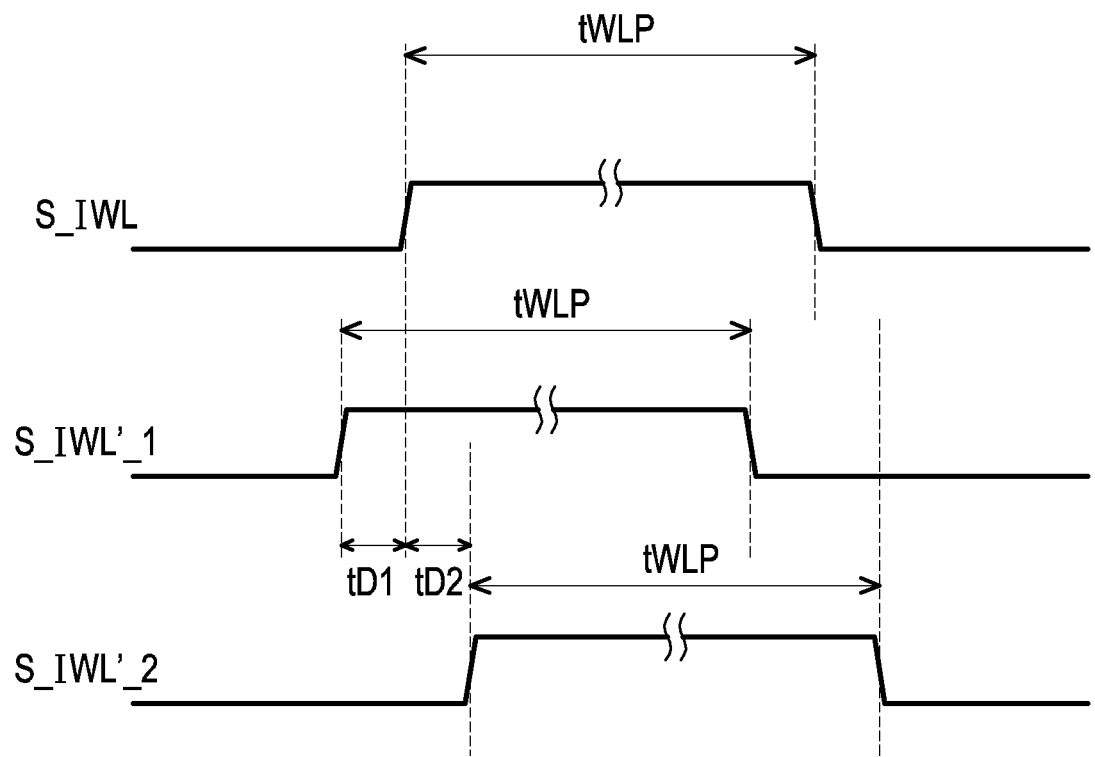
FIG. 7 illustrates waveforms of an internal write latency signal S_IWL and adjusted internal write latency signals according to an embodiment of the disclosure.

Please refer to FIG. 4, FIG. 6 and FIG. 7, FIG. 6 illustrates a flow chart of an adjusting method according to an embodiment of the disclosure. FIG. 7 illustrates waveforms of an internal write latency signal S_IWL and adjusted internal write latency signals according to an embodiment of the disclosure. In the embodiment, the adjusting method S200 is suitable for operating the DQS latching circuit 200. The adjusting method S200 includes steps S210 to S260. In the steps S210, the DQS signal S_DQS is received by the receiver 110. In the steps S220, the counting circuit 220 counts the at least one pulse of the DQS signal S_DQS to generate the adjusting value VA. In the embodiment, the counting circuit 220 counts the at least one edges of the at least one pulse of the DQS signal S_DQS to generate the adjusting value VA in the steps S220.

In the steps S230, the timing adjusting circuit 230 compares the adjusting value VA and the default value VD. When the adjusting value VA is lower than the default value VD, the timing adjusting circuit 230 shifts the timing of the internal write latency signal S_IWL earlier based on a difference value DIFF between the adjusting value VA and the default value VD in the steps S240. Therefore, in the steps S240, the timing adjusting circuit 230 generates an adjusted internal write latency signal S_IWL'_1. In the embodiment, a timing of the adjusted internal write latency signal S_IWL'_1 leads the timing of the internal write latency signal S_IWL by a time length tD1. The time length tD1 is associated with the difference value DIFF between the adjusting value VA and the default value VD.

In the embodiment, the default value VD is a number of the rising edge or the falling edge of at least one pulse of the previous DQS signal, but the disclosure is not limited thereto. The adjusting value VA is a number of rising edge or falling edge of at least one pulse of the previous DQS signal, but the disclosure is not limited thereto.

For example, the default value VD is "2". The adjusting value VA is "1". Therefore, the adjusting value VA is lower than the default value VD. The timing adjusting circuit 230 judges that the DQS S_DQS signal is modified. For example, the DQS signal S_DQS is modified based on a write leveling operation of DDR5, but the disclosure is not limited thereto. In the steps S240, the timing adjusting circuit 230 obtains the difference value DIFF. The difference value DIFF is "−1" (that is, "DIFF=VA−VD"). The timing adjusting circuit 230 sets the time length tD1 as one pulse period in a pulse waveform (referring to FIG. 5A and FIG. 5B) of the DQS signal S_DQS. In the embodiment, the pulse period is a time length between two adjacent rising edges or a time length between two adjacent falling edges.

For example, the default value VD is "3". The adjusting value VA is "1". Therefore, the adjusting value VA is lower than the default value VD. The difference value DIFF is "−2". The timing adjusting circuit 230 sets the time length tD1 as two pulse period in the pulse waveform of the DQS signal S_DQS.

In the steps S230, when the adjusting value VA is higher than the default value VD, the timing adjusting circuit 230 shifts the timing of the internal write latency signal S_IWL later based on the difference value DIFF between the adjusting value VA and the default value VD in the steps S250. Therefore, in the steps S250, the timing adjusting circuit 230 generates an adjusted internal write latency signal S_IWL'_2. In the embodiment, a timing of the adjusted internal write latency signal S_IWL'_2 lags the timing of the internal write latency signal S_IWL by a time length tD2. The time length tD2 is associated with the difference value DIFF between the adjusting value VA and the default value VD.

For example, the default value VD is "1". The adjusting value VA is "2". Therefore, the adjusting value VA is higher than the default value VD. In the steps S240, the timing adjusting circuit 230 obtains the difference value DIFF. The difference value DIFF is "1". The timing adjusting circuit 230 sets the time length tD2 as one pulse period in a pulse waveform of the DQS signal S_DQS.

For example, the default value VD is "1". The adjusting value VA is "3". Therefore, the adjusting value VA is higher than the default value VD. The difference value DIFF is "2". The timing adjusting circuit 230 sets the time length tD2 as two pulse period in the pulse waveform of the DQS signal S_DQS.

Besides, in the steps S230, when the adjusting value VA is equal to the default value VD, comparing result states the DQS signal S_DQS is equal to the previous DQS signal. Therefore, the timing adjusting circuit 230 stops adjusting the timing of the internal write latency signal S_IWL in the step S260.

In the embodiment, the internal write latency signal S_IWL and the adjusted internal write latency signals S_IWL'_1 and S_IWL'_2 have pulse widths tWLP. In other words, the timing adjusting circuit 230 maintains the pulse width of the adjusted internal write latency signals S_IWL'_1 in the step S240, and maintains the pulse width of the adjusted internal write latency signal S_IWL'_2 in the step S250.

In view of the foregoing, the DQS latching circuit and the adjusting method adjust the internal write latency signal according to the adjusting value associated with a number of the at least one pulse. The DQS latching circuit and the adjusting method make the timing of the internal write latency signal matches a timing of the DQS signal. Therefore, even the DQS signal is modified, a write operation of the memory device is normal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A data strobe (DQS) latching circuit for adjusting an internal write latency signal of a memory device, comprising:
   a receiver, configured to receive a DQS signal;
   a counting circuit, coupled to the receiver, configured to count at least one pulse of the DQS signal to generate an adjusting value; and a timing adjusting circuit, coupled to the pulse counter, configured to adjust a timing of the internal write latency signal according to the adjusting value, wherein the timing adjusting circuit compares the adjusting value with a default value and adjusts the timing of the internal write latency signal based on a comparison result between the adjusting value and the default value, and wherein the default value is a previous adjusting value of a previous DOS signal.

2. The DQS latching circuit of claim 1, wherein the counting circuit comprises:

a trigger circuit, coupled to the receiver, configured to obtain at least one edge of the at least one pulse of the DQS signal; and an edge counter, coupled to the trigger circuit and the timing adjusting circuit, configured to count the at least one edge to generate the adjusting value.

3. The DQS latching circuit of claim 2, wherein the trigger circuit is implemented by a flip-flop.

4. The DQS latching circuit of claim 2, wherein:

at least one of the at least one edge of the at least one pulse of the DQS signal is a rising edge, the trigger circuit obtains the at least one rising edge of the at least one pulse of the DQS signal, and the edge counter counts the at least one rising edge to generate the adjusting value.

5. The DQS latching circuit of claim 2, wherein:

at least one of the at least one edge of the at least one pulse of the DQS signal is a falling edge, the trigger circuit obtains the at least one falling edge of the at least one pulse of the DQS signal, and the edge counter counts the at least one falling edge to generate the adjusting value.

6. The DQS latching circuit of claim 1, wherein the adjusting value is proportional to a number of the at least one pulse.

7. The DQS latching circuit of claim 1, wherein:

when the adjusting value is lower than the default value, the timing adjusting circuit shifts the timing of the internal write latency signal earlier based on a difference value between the adjusting value and the default value, and when the adjusting value is higher than the default value, the timing adjusting circuit shifts the timing of the internal write latency signal later based on the difference value between the adjusting value and the default value.

8. The DQS latching circuit of claim 7, wherein when the adjusting value is equal to the default value, the timing adjusting circuit stops adjusting the timing of the internal write latency signal.

9. An adjusting method for adjusting an internal write latency signal of a memory device, comprising:

receiving a data strobe (DQS) signal;

counting, by a counting circuit, at least one pulse of the DQS signal to generate an adjusting value; and adjusting, by a timing adjusting circuit, a timing of the internal write latency signal according to the adjusting value, wherein the step of adjusting the timing of the internal write latency signal according to the adjusting value comprises:

the timing adjusting circuit compares the adjusting value with a default value, wherein the default value is a previous adjusting value of a previous DQS signal; and adjusting the timing of the internal write latency signal based on a comparison result between the adjusting value and the default value.

10. The adjusting method of claim 9, wherein the step of counting at least one pulse of the DQS signal to generate an adjusting value comprises:

obtaining at least one edge of the at least one pulse of the DQS signal and counting the at least one edge to generate the adjusting value.

11. The adjusting method of claim 9, wherein the step of obtaining the at least one edge of the at least one pulse of the DQS signal comprises:

obtaining at least one rising edge of the at least one pulse of the DQS signal and counting the at least one rising edge to generate the adjusting value.

12. The adjusting method of claim 9, wherein the step of obtaining the at least one edge of the at least one pulse of the DQS signal comprises:

obtaining at least one falling edge of the at least one pulse of the DQS signal and counting the at least one falling edge to generate the adjusting value.

13. The adjusting method of claim 9, wherein the adjusting value is proportional to a number of the at least one pulse.

14. The adjusting method of claim 9, wherein the step of adjusting the timing of the internal write latency signal based on the comparison result between the adjusting value and the default value comprises:

when the adjusting value is lower than the default value, shifting the timing of the internal write latency signal earlier based on a difference value between the adjusting value and the default value, and when the adjusting value is higher than the default value, shifting the timing of the internal write latency signal later based on the difference value between the adjusting value and the default value.

15. The adjusting method of claim 14, further comprising:

when the adjusting value is equal to the default value, stopping adjusting the timing of the internal write latency signal.

* * * * *